United States Patent
Fernando et al.

(10) Patent No.: US 10,382,048 B2
(45) Date of Patent: Aug. 13, 2019

(54) CALIBRATION OF ANALOG-TO-DIGITAL CONVERTER DEVICES

(71) Applicant: ANALOG DEVICES, INC., Norwood, MA (US)

(72) Inventors: Paul R. Fernando, Burlington, MA (US); Sudarshan Ananda Natarajan, Raleigh, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 382 days.

(21) Appl. No.: 15/153,711

(22) Filed: May 12, 2016

(65) Prior Publication Data
US 2016/0352347 A1    Dec. 1, 2016

Related U.S. Application Data

(60) Provisional application No. 62/167,434, filed on May 28, 2015.

(51) Int. Cl.
*H01J 40/14*   (2006.01)
*H03M 1/10*    (2006.01)
(Continued)

(52) U.S. Cl.
CPC ....... *H03M 1/1009* (2013.01); *H03M 1/0639* (2013.01); *H03M 1/1061* (2013.01);
(Continued)

(58) Field of Classification Search
CPC .... H03M 1/1009; H03M 1/466; H03M 1/201; H03M 1/0639; H03M 1/1061
(Continued)

(56) References Cited

U.S. PATENT DOCUMENTS

| | | | | |
|---|---|---|---|---|
| 4,896,155 A | * | 1/1990 | Craiglow | ............ H03M 1/1038 341/120 |
| 6,894,631 B1 | * | 5/2005 | Bardsley | ............... H03M 1/201 341/118 |

(Continued)

FOREIGN PATENT DOCUMENTS

| | | |
|---|---|---|
| AU | 2013392022 | 2/2015 |
| CN | 104052477 A | 9/2014 |

OTHER PUBLICATIONS

H.-J. Lin et al., *A Mutual Characterization Based SAR ADC Self-Testing Technique*, 2013 18th IEEE European Test Symposium (ETS), 978-1-4673-6377-8/13 © 2013 IEEE, 6 pages.

(Continued)

*Primary Examiner* — Georgia Y Epps
*Assistant Examiner* — Kevin Wyatt
(74) *Attorney, Agent, or Firm* — Patent Capital Group

(57) ABSTRACT

Disclosed herein are systems for calibrating an analog-to-digital converter (ADC) device, as well as related devices and methods. In some embodiments, a system for calibrating an ADC device may include an ADC device, wherein the ADC device includes an ADC and a dither source, and wherein the ADC device is to apply a set of calibration parameters to generate digital outputs. The system may also include calibration circuitry, coupled to the ADC device, to determine which of multiple sets of values of calibration parameters results in the digital outputs having the lowest amount of noise, and to cause the ADC device to apply the calibration parameters associated with the lowest noise.

20 Claims, 4 Drawing Sheets

(51) Int. Cl.
  *H03M 1/46*  (2006.01)
  *H03M 1/20*  (2006.01)
  *H03M 1/06*  (2006.01)

(52) U.S. Cl.
  CPC ........... *H03M 1/201* (2013.01); *H03M 1/466* (2013.01); *H03M 1/468* (2013.01)

(58) Field of Classification Search
  USPC .............................................. 250/208.1, 206
  See application file for complete search history.

(56) References Cited

U.S. PATENT DOCUMENTS

| | | | |
|---|---|---|---|
| 7,002,495 B1 | 2/2006 | Batruni | |
| 7,085,663 B1 | 8/2006 | Tsyrganovich | |
| 8,497,790 B1* | 7/2013 | Lewis | H03M 1/1019 341/118 |
| 9,124,292 B2 | 9/2015 | Li et al. | |
| 2006/0176197 A1* | 8/2006 | McNeill | H03M 1/1004 341/120 |
| 2007/0297025 A1* | 12/2007 | Kato | H04N 5/243 358/482 |
| 2015/0349794 A1* | 12/2015 | Lin | H03M 1/1004 341/120 |
| 2016/0182075 A1* | 6/2016 | Devarajan | H03M 1/1019 341/120 |

OTHER PUBLICATIONS

X.-L. Huang et al., *A Self-Testing and Calibration Method for Embedded Successive Approximation Register ADC*, Laboratory of Dependable Systems, ASPDAC 2011, 33 pages.

Kunihiko Iizuka et al., *A 14-bit Digitally Self-Calibrated Pipelined ADC with Adaptive Bias Optimization for Arbitrary Speeds Up to 40 MS/s*, IEEE Journal of Solid-State Circuits, vol. 41, No. 4, Apr. 2006, 0018-9200 © 2006 IEEE, 8 pages.

J. Goes et al., *Purely-Digital versus Mixed-Signal Self-Calibration Techniques in High-Resolution Pipeline ADCs*, 978-1-4244-8278-8/10 © 2010 IEEE, 8 pages.

Walt Kester, *ADC Architectures II: Successive Approximation ADCs*, Analog Devices, MT-021 Tutorial, Rev. A, 10/08 WK, 14 pages.

OA1 issued in CN Patent Application Serial No. 201610363899.2 dated Feb. 2, 2019, 10 pages.

* cited by examiner

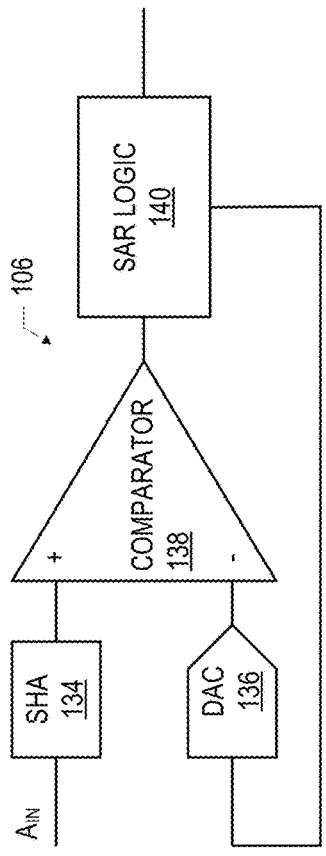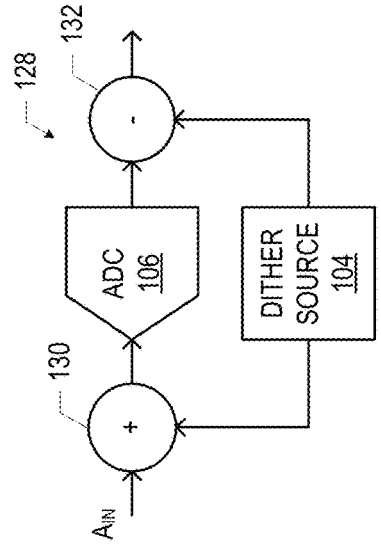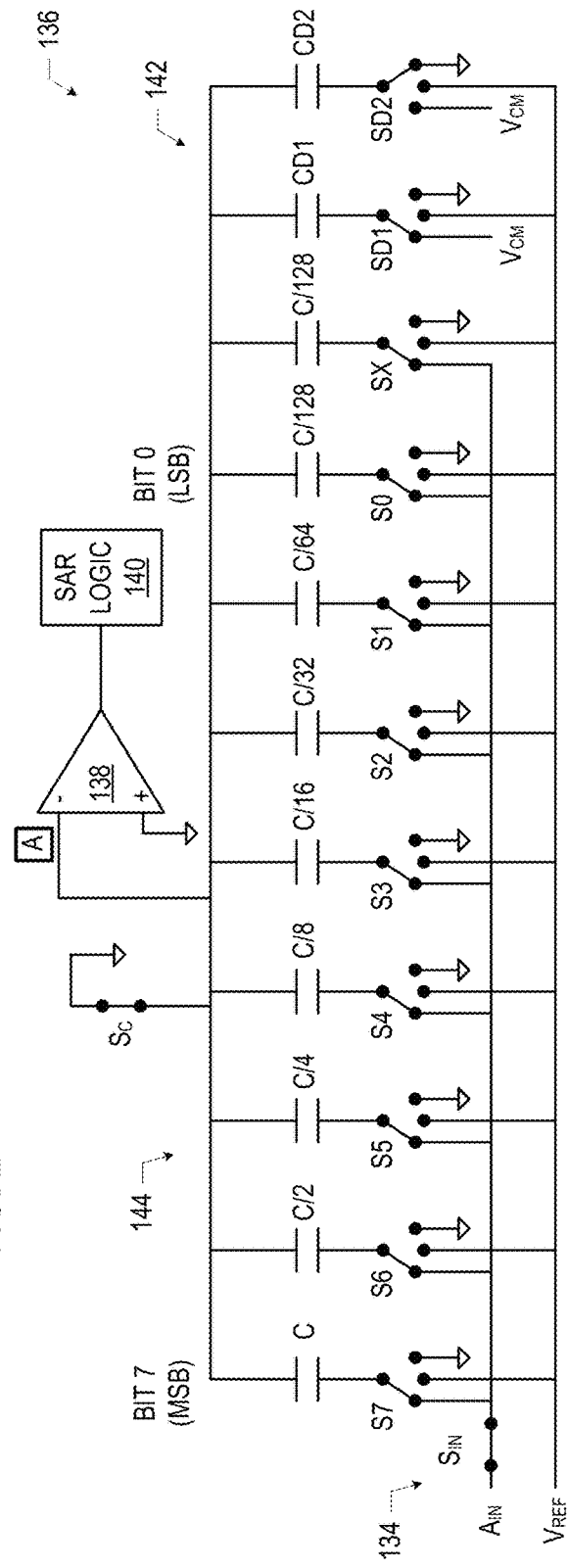
FIG. 2
FIG. 3
FIG. 4

CALIBRATION OF ANALOG-TO-DIGITAL CONVERTER DEVICES

CROSS-REFERENCE TO RELATED APPLICATION

This application claims priority to U.S. Provisional Patent Application No. 62/167,434, filed May 28, 2015, and titled "CALIBRATION OF ANALOG-TO-DIGITAL CONVERTERS." The entirety of this priority application is incorporated by reference herein.

BACKGROUND

An ideal analog-to-digital converter (ADC) should exhibit a linear relationship between its analog inputs and its digital outputs. In actual ADCs, this relationship is often nonlinear due to component mismatches, nonideal layout, modeling limitations, and other sources of variation from ideal or expected behavior.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 2 is a block diagram of a portion of an ADC device that may be included in the system of FIG. 1, in accordance with various embodiments.

FIG. 3 is a block diagram of an example of a successive-approximation-register (SAR) ADC that may be included in the system of FIG. 1, in accordance with various embodiments.

FIG. 4 is a schematic illustration of an example of the SAR ADC of FIG. 3, in accordance with various embodiments.

DETAILED DESCRIPTION

Figure 1:
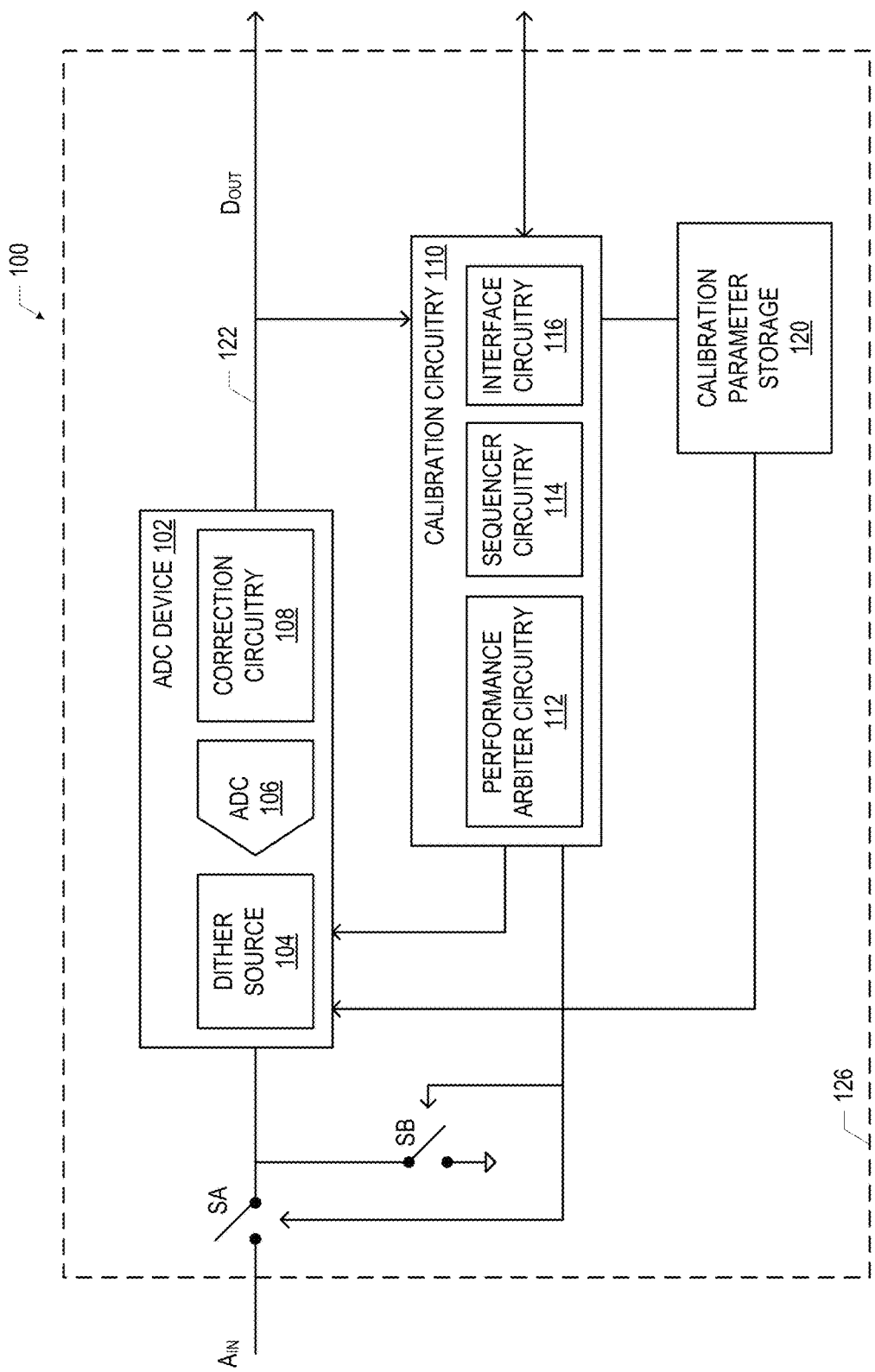
FIG. 1 is a block diagram of a system for calibrating an analog-to-digital converter (ADC) device, in accordance with various embodiments.

Disclosed herein are systems for calibrating an analog-to-digital converter (ADC) device, as well as related devices and methods. In some embodiments, a system for calibrating an ADC device may include an ADC device, wherein the ADC device includes an ADC and a dither source, and wherein the ADC device is to apply a set of calibration parameters to generate digital outputs. The system may also include calibration circuitry, coupled to the ADC device, to determine which of multiple sets of values of calibration parameters results in digital outputs having the lowest amount of noise, and to cause the ADC device to apply the calibration parameters associated with the lowest noise.

As noted above, component mismatches due to process variation (e.g., capacitor mismatches), nonideal layout, and modeling limitations may result in nonlinearities in an ADC's transfer curve. Conventionally, linearity errors may be reduced by injecting random noise to the input in the analog domain and subtracting the equivalent from the digital domain. This process of adding random noise to improve an ADC's linearity beyond its inherent linearity is known as dithering. Dithering, however, may also be subject to error due to component mismatches. If the amount of analog noise added is not equal to the amount of digital noise subtracted, the performance of an ADC may get worse instead of better. The metrics conventionally used to measure nonlinearity are integral nonlinearity (INL) and differential nonlinearity (DNL), where the INL is the running sum of the DNL. Typically, an INL/DNL measurement requires a changing input to sweep the ADC transfer curve.

Calibration may be employed to minimize the impact of component mismatch. Calibration may keep track of each component deviation from its ideal value and may attempt to minimize the errors introduced by this deviation in the digital domain. Each calibration run may update a set of calibration parameters (e.g., calibration coefficients) stored in a calibration look-up table (LUT). In various ones of the embodiments disclosed herein, calibration can be implemented as a foreground process (e.g., by performing a calibration run on demand at start-up, or when operating conditions change) or as a background process (e.g., on a regular schedule).

Even with significant averaging, conventional calibration may be susceptible to noise in the system. This may result in INL/DNL variation from calibration run to calibration run. Increasing the number of samples during ADC calibration is the most common method used to reduce noise. While this strategy may reduce the noise of the main distribution, it has little effect on the skewed components of the variation. As disclosed herein, performance may be improved by picking the "best" calibration run and weeding out the others. Various embodiments are presented herein for addressing the challenge of defining and implementing efficient techniques for determining which calibration runs are good (and therefore should be relied upon) and which calibration runs are bad (and therefore should be discarded).

Various ones of the embodiments disclosed herein recognize that dithering maps nonlinearity at various mid-level codes (e.g., bits 7 to 10 in a 16-bit ADC) to narrower code (e.g., least significant bit (LSB)) sections. The consequence is that the addition of dither results in higher noise. If the dither components are calibrated following the components of the ADC (e.g., the "regular" components of the ADC when the ADC includes the dither components), since errors accumulate, a weak calibration of the dither components may indicate that the components of the ADC were weakly calibrated as well (i.e., that this was a weak calibration run overall).

A key observation is that a weak calibration of the dither components may appear at the output of the ADC as higher overall noise. As used herein, "noise" may refer to any suitable measure of variability in a signal. Particular examples of noise measures may include variance, standard deviation, a higher central moment, or any other variability measure. Various ones of the embodiments disclosed herein may utilize a noise measurement at the output of an ADC as a substitute for an INL or DNL measurement in order to distinguish between good and bad calibration runs. The ability to use a simple and fast test like noise as a metric to judge the accuracy of a calibration run, instead of a computationally expensive metric like INL or DNL, may result in significant practical performance improvements. In some of the embodiments disclosed herein, circuitry may be embedded in a device to distinguish between good and bad calibration runs, and to select the calibration run that achieves the best noise performance (and consequently, good INL/DNL performance).

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

FIG. 1 is a block diagram of a system 100 for calibrating an ADC device 102, in accordance with various embodiments. The system 100 includes the ADC device 102 and calibration circuitry 110. The calibration circuitry 110 may be coupled to the ADC device 102 and may control the calibration parameters used by the ADC device 102 in accordance with the techniques disclosed herein.

The ADC device 102 may include a dither source 104, an ADC 106, and correction circuitry 108. Although the dither source 104, the ADC 106, and the correction circuitry 108 are indicated separately in FIG. 1, multiple ones of these components may be physically or logically combined as desired within various implementations of the ADC device 102.

The dither source 104 may be a source of analog noise for the ADC 106, as discussed above. For example, FIG. 2 is a block diagram of a dithering arrangement 128 in which the dither source 104 generates analog noise that is provided to a summing junction 130 input to the ADC 106. The dither source 104 also generates a digital representation of the analog noise and provides it to the difference junction 132 so that the digital representation of the analog noise may be subtracted from the output of the ADC 106. In some embodiments, the dither source 104 may be separate from the ADC 106, while in other embodiments, the dither source 104 may be included in the ADC 106 (and, e.g., the summing junction 130 may be included in the combined dither source 104/ADC 106). An example of the latter embodiment is discussed below with reference to FIG. 4. In some embodiments, the difference junction 132 may be provided by the correction circuitry 108.

The correction circuitry 108 may be coupled to the output of the ADC 106, and may adjust the "raw" digital signal provided by the ADC 106 to generate a "corrected" digital signal that may be output by the ADC device 102 as the digital output 122 ($D_{OUT}$). In some embodiments, the correction circuitry 108 may apply calibration parameters to the raw digital signal provided by the ADC 106 to generate the corrected digital signal. These calibration parameters, and the techniques used by the correction circuitry 108 to apply them, may take the form of any ADC calibration techniques known in the art. For example, the calibration parameters may include calibration coefficients associated with different ones of the bit capacitors included in a switched capacitor digital-to-analog converter (DAC) of a successive-approximation-register (SAR) ADC, as discussed below with reference to FIGS. 3 and 4. The calibration parameters applied by the correction circuitry 108 may be stored in the calibration parameter storage 120, which may be coupled to the ADC device 102 and to the calibration circuitry 110. The calibration parameter storage 120 may take the form of any of the storage devices disclosed herein and may include, for example, an LUT in which the calibration parameters are organized.

The calibration circuitry 110 may receive the digital output 122 from the ADC device 102, and may control the calibration of the ADC device 102. In particular, the calibration circuitry 110 may control the calibration parameters stored in the calibration parameter storage 120, and may also control the calibration runs executed by the ADC device 102. The calibration circuitry 110 may include performance arbiter circuitry 112, sequencer circuitry 114, and interface circuitry 116. Although the performance arbiter circuitry 112, the sequencer circuitry 114, and the interface circuitry 116 are indicated separately in FIG. 1, multiple ones of these components may be physically or logically combined as desired within various implementations of the calibration circuitry 110. For example, in some embodiments, the calibration circuitry 110 may be provided by an embedded custom programmable processor including performance arbiter logic, sequencer logic, and interface logic. In some embodiments, this programmable processor may be a digital signal processor (DSP). The calibration circuitry 110 may also include any suitable memory to support the operations disclosed herein.

The performance arbiter circuitry 112 may be configured to analyze the digital outputs 122 from the ADC device 102. In some embodiments, the performance arbiter circuitry 112 may be configured to measure an amount of noise in a group of digital outputs 122 generated by the ADC device 102 and compare the amount of noise in multiple different groups of digital outputs 122 (e.g., to identify the "best" calibration run), as discussed in detail below.

The sequencer circuitry 114 may be configured to communicate with the ADC device 102 to adjust the calibration settings of the ADC device 102 (e.g., the calibration length) and manipulate the calibration parameter values stored in the calibration parameter storage 120. The sequencer circuitry 114 may initiate a calibration run of the ADC device 102 and manage the timing of the calibration run. In some embodiments, the sequencer circuitry 114 may communicate with the ADC device 102 to change a bias or trim setting of the ADC device 102, as discussed in detail below. In some embodiments, the sequencer circuitry 114 may take the form of a programmable state machine.

The interface circuitry 116 may provide an interface between the calibration circuitry 110 and one or more other computing devices. For example, the interface circuitry 116 may provide a serial peripheral interface (SPI) connection between the calibration circuitry 110 and another device on an SPI bus. In some embodiments, data received at the calibration circuitry 110 from the interface circuitry 116 may be used in the control of the calibration process. For example, a value for the calibration length (generated by human user or automatically generated by another computing device) may be received at the calibration circuitry 110 via the interface circuitry 116. In some embodiments, the interface circuitry 116 may be used to report out data from the calibration circuitry 110 to another computing device. For example, the values of the calibration parameters stored in the calibration parameter storage 120 may be reported out to another computing device via the interface circuitry 116. In some embodiments, the calibration circuitry 110 may be programmable, and may receive updated calibration algorithms via the interface circuitry 116. The calibration circuitry 110 may implement those updated calibration algorithms during operation (e.g., after the system 100 has left the factory).

During a calibration run, the switch SA may be opened (decoupling the input of the ADC device 102 from the analog input $A_{IN}$) and the switch SB may be closed (coupling the input of the ADC device to a known voltage). Although the known voltage indicated in FIG. 1 is ground (and thus closing of the switch SB may represent an internal input short), any known voltage may be used. The switches SA and SB may be controlled by the sequencer circuitry 114. Once the switch SB is closed, different ones of the calibration parameters of the ADC device 102 may be set using any conventional calibration technique known in the art. For example, a first calibration coefficient may be set in a particular calibration expression to minimize error, then a second calibration coefficient may be set in the calibration expression using the set value of the first calibration coefficient, then a third calibration coefficient may be set in the calibration expression using the set values of the first and second calibration coefficients, etc. A calibration run is complete when the calibration circuitry 110 has determined values for each of the required calibration parameters.

The calibration circuitry 110 may perform multiple calibration runs, and may compare their quality to select the calibration run that is likely to yield the best performance. In particular, after a particular calibration run (with an associated set of calibration parameters), the switch SB may be closed and the performance arbiter circuitry 112 may receive a number of samples of the digital output 122 generated by the ADC device 102 as it operates under the set of calibration parameters. The performance arbiter circuitry 112 may generate a noise measure representative of the variability in these samples, as discussed above. The performance arbiter circuitry 112 may store the noise measure and the associated set of calibration parameters (e.g., in a storage device included in the calibration circuitry 110, not shown), and then the calibration circuitry 110 may initiate a new calibration run. After this new calibration run (generating a new set of calibration parameters), the switch SB may be closed and the performance arbiter circuitry 112 may again receive a number of samples of the digital output 122 generated by the ADC device 102, this time operating under the new set of calibration parameters. The performance arbiter circuitry 112 may generate a new noise measure representative of the variability in the samples, and may store this new noise measure against the previously stored noise measure. If the new noise measure is lower than the previously stored noise measure, the performance arbiter circuitry 112 may determine that the new calibration run is a higher-quality run than the previous calibration run, and the new set of calibration parameters may be stored in the calibration parameter storage 120 used by the ADC device 102 during normal operation. The comparison of the results of two calibration runs is simply illustrative, and the calibration circuitry 110 may compare more than two calibration runs, as desired. A particular embodiment of a method of calibrating the ADC device 102 is discussed below with reference to FIG. 5.

In some embodiments, the ADC 106 may be a SAR ADC. FIG. 3 is a block diagram of an example ADC 106 that takes the form of a SAR ADC. The SAR ADC 106 of FIG. 3 may use the DAC 136 to successively compare reference voltages to the analog input signal $A_{IN}$, as discussed below.

The ADC 106 may include a sample-and-hold amplifier (SHA) 134, a digital-to-analog converter (DAC) 136, a comparator 138, and SAR logic 140. The SHA 134 may receive at its input, the analog input signal $A_{IN}$, and may provide a sample of the value of the analog input signal $A_{IN}$ to an input terminal of the comparator 138. The comparator 138 may generate an output that indicates whether the input at one input terminal is greater than or less than the input at the other input terminal. The DAC 136 may provide an analog value to the other input terminal of the comparator 138, and that analog value may be the result of a digital-to-analog conversion of an input value provided to the DAC 136 by the SAR logic 140. The DAC 136 may start at mid-scale, and, based on the output of the comparator 138, the SAR logic 140 may change the digital values provided to the DAC 136 so that the output of the DAC 136 sequentially converges toward a value that yields the least difference between the output of the SHA 134 and the output of the DAC 136. The SAR logic 140 may provide the digital input associated with this value as the digital output of the ADC 106. An N-bit conversion may take N comparison steps. As discussed above with reference to FIG. 1, this digital output may be the "raw" digital output, and may be provided to the correction circuitry 108 for correction.

When the ADC 106 is a SAR ADC, the overall accuracy and linearity of the ADC 106 may be determined primarily by the accuracy and linearity of the internal DAC 136. Conventionally, most precision SAR ADCs have used laser-trimmed thin-film DACs to achieve a desired accuracy and linearity. The process of thin-film resistor trimming adds cost, and the values of the thin-film resistor included in the thin-film DAC may be affected when subjected to the mechanical stresses of packaging. Switched capacitor (or charge-redistribution) DACs may not exhibit these drawbacks. The accuracy and linearity of many switched capacitor DACs are primarily determined by high-accuracy photolithography, which in turn controls the capacitor plate area and the capacitance as well as matching. In addition, small capacitors may be placed in parallel with the main bit capacitors, and these small capacitors can be switched in and out under control of autocalibration routines to achieve high accuracy and linearity (without the need for thin-film laser trimming). In some embodiments, the DAC 136 may be a switched capacitor DAC.

FIG. 4 illustrates an example of an 8-bit switched capacitor DAC 136. The switches are shown in the track (or sample, or acquisition) phase in which the analog input voltage, $A_{IN}$, is constantly charging and discharging the parallel combination of all the bit capacitors 144. A hold phase is initiated by opening $S_{IN}$, leaving the sampled analog input voltage on the capacitor array. The switch $S_C$ is then opened to begin the conversion phase. A charge proportional to $A_{IN}$ is now trapped in the capacitor array. If S0-S7 are all connected to ground, a voltage equal to $-A_{IN}$ appears at node A. Connecting S7 to the reference voltage $V_{REF}$ adds a voltage equal to $V_{REF}/2$ to $-A_{IN}$ (i.e., the voltage at node A, $V_A$, becomes equal to $-A_{IN}+V_{REF}/2$). The output of the comparator 138 is high if $V_A<0$ (i.e., $A_{IN}>V_{REF}/2$). The output of the comparator 138 is low if $V_A>0$ (i.e., $A_{IN}<V_{REF}/2$). If the output of the comparator 138 is high, the SAR logic 140 may keep the switch S7 connected to $V_{REF}$; if the output of the comparator 138 is low, the SAR logic 140 may connect the switch S7 to ground. The next switch S6 is then connected to $V_{REF}$, and the new voltage $V_A$ is compared with ground, as discussed above. This sequence continues for all of the switches S7-S0; at the end of the conversion interval, the voltage at node A is equal to:

$$V_A = -A_{IN} + B7*V_{REF}/2 + B6*V_{REF}/4 + B5*V_{REF}/8 + \ldots + B0*V_{REF}/128$$

where Bi is 1 if the switch Si is connected to $V_{REF}$, and 0 if the switch Si is connected to ground. The values Bi provide the digital representation of the analog input $A_{IN}$. A dummy capacitor (associated with switch SX) is included so that the total capacitance of the (binary weighted values of the) array adds to 2C; this dummy capacitor is connected to $A_{IN}$ during the acquisition phase and connects to ground during the conversion phase (and does not take an active role in the bit decision process). At the end of the conversion interval, S0-S7, and $S_{IN}$ are connected to $A_{IN}$, $S_C$ is connected to ground, and the converter is ready for another cycle.

The switched capacitor DAC 136 of FIG. 4 also includes two dither capacitors 142 acting as the dither source 104. The use of two dither capacitors 142 in FIG. 4 is simply illustrative, and any desired number of dither capacitors 142 may be included. During the acquisition phase, the dither capacitors 142 may be randomly (or pseudorandomly) connected to ground or $V_{REF}$ (e.g., by the correction circuitry 108). During the conversion phase, the dither capacitors 142 may be switched to $V_{CM}$, thereby adding or subtracting some amount of voltage to the node A in the analog domain. The voltage at $V_{CM}$ may be equal to $V_{REF}/2$. A digital code, corresponding to the amount of voltage added or subtracted in the digital domain, may be subtracted in the digital domain to remove the dither from the output (e.g., as discussed above with reference to the difference junction 132 of FIG. 2).

Most SAR ADCs employ calibration to minimize errors in the capacitor array of the DAC 136. These calibration schemes are often stochastic in nature, resulting in varying ADC transfer curves from calibration to calibration, and consequently, noise variation from calibration to calibration. Calibrating dither bits adds a skewed component (additive noise) to the noise variation. In particular, in some embodiments, the calibration parameter storage 120 may store different calibration coefficients associated with some or all of the bit capacitors 144 and the dither capacitors 142. For example, in an illustrative embodiment, the calibration parameters may include calibration coefficients for the four most significant bits B7-B4 and for the dither capacitors 142. The least significant bits B3-B0 may not be calibrated. A calibration run may begin by calibrating (measuring the error of) B4 utilizing assumed known values of the capacitances of the bit capacitors 144 associated with B3-B0. Once B4 is calibrated, B5 may then be calibrated, using the calibrated value of B4 along with the assumed known values of the capacitances of the bit capacitors 144 associated with B3-B0. This process may continue to calibrate B6 (based on B5, B4, and B3-B0) and B7 (based on B6, B5, B4, and B3-B0). After the bit capacitors 144 have been calibrated, the dither capacitors 142 may be calibrated, using the calibrated values of B7-B4 and the assumed known values of B3-B0. Since the calibrated bits B7-B4 have been used to calibrate the dither capacitors 142, the error in the calibrations of B7-B4 may accumulate and appear in the calibration of the dither capacitors 142. When the dither capacitors 142 toggle randomly during normal operation, the error that was accumulated during calibration will manifest itself as noise (since the dither applied in the analog domain isn't perfectly subtracted in the digital domain). Measurements of this noise may thus indicate the quality of the calibration run.

Figure 5:
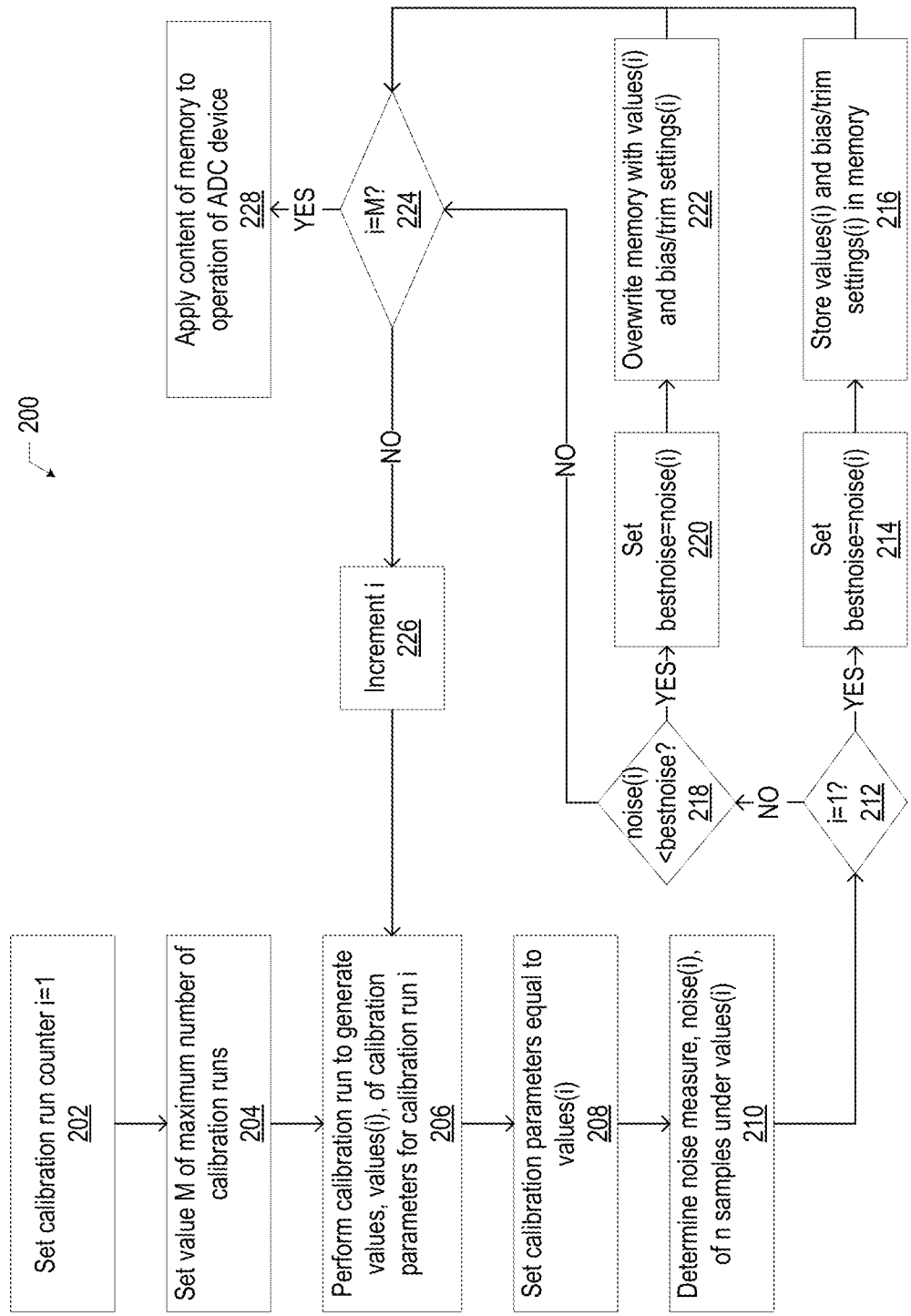
FIG. 5 is a flow diagram of a method of calibrating an ADC device, in accordance with various embodiments.

FIG. 5 is a flow diagram of a method 200 for calibrating an ADC device, in accordance with various embodiments. Although operations in the method 200 are discussed in a particular order, various ones of these operations may be performed in other orders or in parallel, as suitable. Various ones of the operations illustrated in FIG. 5 may be omitted, as suitable. Although the method 200 may be illustrated in the discussion below with reference to FIGS. 1-4, the method 200 may be used to calibrate any suitable ADC device.

At 202, the calibration circuitry 110 (e.g., the sequencer circuitry 114) may set a calibration run counter i equal to 1 (or another suitable initial value).

At 204, the calibration circuitry 110 (e.g., the sequencer circuitry 114) may set a value M representative of a maximum number of calibration runs to be performed. In some embodiments, the value of M may be provided to the calibration circuitry 110 from an external computing device via the interface circuitry 116.

At 206, the calibration circuitry 110 (e.g., the sequencer circuitry 114) may cause a calibration run to be performed to generate a set of values (denoted by values(i)) of calibration parameters for calibration run i. For example, the calibration parameters may specify calibration coefficients associated with different ones of the bit capacitors 144 and the dither capacitors 142 included in a switched capacitor DAC 136 (e.g., as discussed above with reference to FIG. 4).

At 208, the calibration circuitry 110 (e.g., the sequencer circuitry 114) may set the calibration parameters for operation of the ADC device 102 equal to the values in values(i). As a result, the ADC device 102 may apply the calibration parameter values in values(i) during its operation.

At 210, the calibration circuitry 110 (e.g., the performance arbiter circuitry 112) may determine a noise measure (denoted by noise(i)) of a number n>0 of samples of the digital output 122 generated by the ADC device 102 while the ADC device 102 applies the calibration parameter values in values (i). The noise measure determined at 210 may take the form of any of the noise measures discussed herein (e.g., a variance).

At 212, the calibration circuitry 110 (e.g., the performance arbiter circuitry 112) may determine whether the calibration run i is the first calibration run. If yes, the calibration circuitry 110 may proceed to 214 and store the noise measure noise(i) in a memory as the best observed noise measure (denoted by bestnoise), and also proceed to 216 in store values(i) in the memory. The memory may be, for example, a register or other memory structure included in the calibration circuitry 110.

At 216, the calibration circuitry 110 (e.g., the sequencer circuitry 114) may also store, in memory, any bias/trim settings of the ADC device 102 during the calibration run i. The calibration circuitry 110 (e.g., the sequencer circuitry 114) may then proceed to 224, and determine whether the current calibration run i is to be the last calibration run (M). If i=M, the calibration circuitry 110 may proceed to 228 and apply the content of the memory to the operation of the ADC device 102. For example, the calibration circuitry 110 (e.g., the sequencer circuitry 114) may provide the values of the calibration parameters stored in memory to the calibration parameter storage 120 so that the ADC device 102 uses those values during its normal operation. If more calibration runs are to be performed, the calibration circuitry 110 (e.g., the sequencer circuitry 114) may proceed to 226 and increment the value of i before returning to 206 and commencing another calibration run.

If the calibration circuitry 110 determines at 212 that the calibration run i is not the first calibration run, the calibration circuitry 110 (e.g., the performance arbiter circuitry 112) may proceed to 218 and determine whether the noise measure noise(i) is less than the best observed noise measure bestnoise. If yes, the calibration circuitry 110 may proceed to 220 and store the noise measure noise(i) as the best observed noise measure (denoted by bestnoise), and proceed to 222 in store values(i) in memory. At 222, the calibration circuitry 110 (e.g., the sequencer circuitry 114) may also store, in memory, any bias/trim settings of the ADC device 102 during the calibration run i. The calibration circuitry 110 may then proceed to 224, as discussed above.

If the calibration circuitry 110 determines at 218 that the noise measure noise(i) is greater than the best observed noise measure bestnoise, the calibration circuitry 110 may proceed to 224. In this manner, the calibration parameters of the ADC device 102 may be updated with the values associated with the lowest performance noise.

Figure 6:
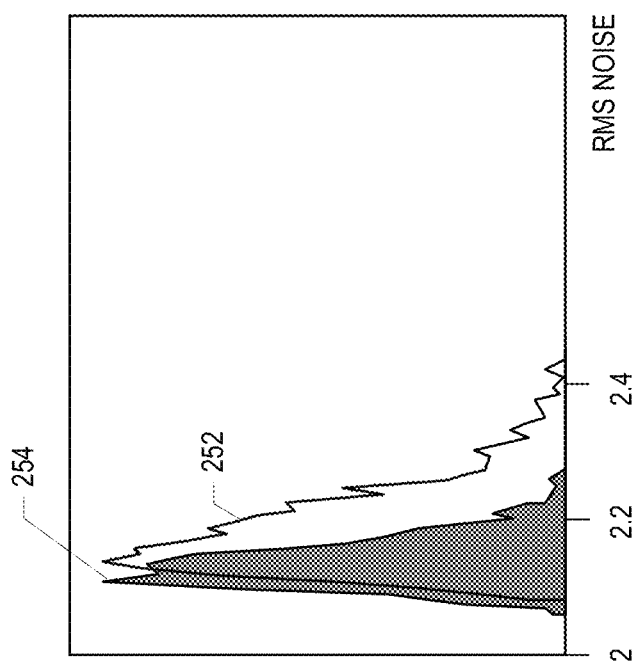
FIG. 6 is a plot depicting example performance improvements that may be achieved upon use of various embodiments disclosed herein.

The systems 100 disclosed herein may be used in any suitable applications. For example, the system 100 may be deployed in an electronic imaging device, wherein the analog input $A_{IN}$ may be provided by an image transducer (e.g., a charge-coupled device (CCD)). An important customer specification in imaging applications is to maintain the noise at grounded input level below a threshold. Noise and noise variation from calibration to calibration need to be kept under control. Various ones of the embodiments disclosed herein may dramatically improve upon conventional techniques and may achieve the noise goals of imaging applications. For example, FIG. 6 illustrates normalized histograms of the root-mean-square values of noise in the LSB across multiple calibration runs by two different ADC devices: a conventional ADC device (histogram 252) and an ADC device 102 in the system 100 (histogram 254). The histogram 254 demonstrates the reduced noise variability between calibration runs that may be achieved by the system 100 (which may be, e.g., a reduction in standard deviation of approximately 50%).

As suggested above, in some embodiments, the sequencer circuitry 114 may initiate calibration and manage system timing. The performance arbiter circuitry may measure noise in each calibration run and identify the best run. Noise may be measured by analyzing many ADC output samples with the internal input short enabled, for example. The sequencer circuitry 114 may save the best calibration coefficients per channel and lock in the best calibration settings prior to entering the normal mode of operation of the ADC device 102. This sequence can be run on demand, or as a factory calibration routine where the optimal LUT data is stored in nonvolatile memory (NVM, e.g., as the calibration parameter storage 120) and loaded each time the system 100 is powered up.

Figure 7:
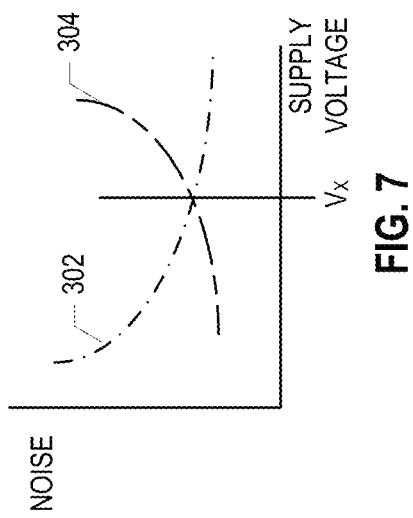
FIGS. 7 and 8 are plots depicting selective setting, by the system of FIG. 1, of bias or trim values in an ADC device, in accordance with various embodiments.
Figure 8:
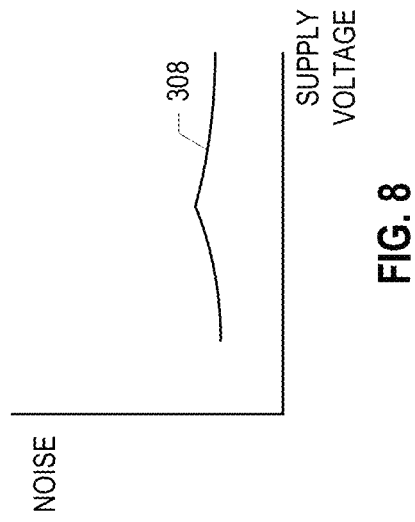

In some embodiments, the calibration circuitry 110 may dynamically adjust bias/trim settings of the ADC device 102 to improve performance. Producing accurate device models for analog circuit design is a challenge, particularly at fine process geometries. This challenge often results in the addition of various ADC bias/trim settings (e.g., settings of the comparator 138 and the DAC 136) that need to be optimized at the time of characterization. However, the optimal bias/trim settings may vary with operating conditions (e.g., supply voltage, temperature, frequency, etc.) and process variations. Typically, such bias/trim settings are optimized in the factory for the nominal operating conditions, resulting in suboptimal performance over varying operating conditions and parts. To address this, in some embodiments, the calibration circuitry 110 may set bias and trim settings in real time to improve performance of the ADC device 102. In some such embodiments, the performance arbiter circuitry 112 may measure noise for each bias/trim setting and identify the best setting for the current operating condition of the ADC device 102. For example, FIG. 7 is a plot of noise versus supply voltage curves 302 and 304 for two different sets of bias/trim settings. When the supply voltage is below a value $V_X$, the bias/trim settings associated with the curve 304 exhibit lower noise; when the supply voltage is above the value $V_X$, the bias/trim settings associated with the curve 302 exhibit lower noise. The calibration circuitry 110 (e.g., the performance arbiter circuitry 112) may analyze the available noise data as a function of bias/trim settings (collected, e.g., as discussed above with reference to 216 and 222 of the method 200 of FIG. 5) and may set the bias/trim settings of the ADC device 102 along with setting the values of the calibration parameters (e.g., as discussed above with reference to 228 of the method 200 of FIG. 5). FIG. 8 illustrates the result of this intervention by the calibration circuitry 110 for the example data illustrated in FIG. 7; the calibration circuitry 110 may cause the ADC device 102 to operate in accordance with the curve 308, providing the lowest noise settings known for the particular supply voltage. Although the operating condition discussed with reference to FIGS. 7 and 8 is supply voltage, any other operating condition (e.g., temperature, frequency, etc.) may be treated in the manner discussed above to improve performance of the ADC device 102. Thus, in some embodiments, the calibration circuitry 110 may provide a fixed or programmable circuit that analyzes the output of the ADC device 102 (which may include, e.g., a SAR ADC) and varies ADC control (trim/bias) settings accordingly to obtain the best noise and linearity performance.

The programmable nature of some embodiments of the calibration circuitry 110 unlocks the ability to decouple calibration algorithm development from slow silicon revision cycles. Additionally, each algorithm can be implemented to fulfill each customer's specific performance needs. For instance, algorithms may be implemented to optimize low-frequency noise, kickback, crosstalk, and/or start-up time, depending upon the needs of the application.

Various ones of the embodiments disclosed herein utilize a noise measurement as an effective substitute for an INL measurement in order to distinguish between good and bad calibration runs in ADCs with calibration. Various ones of the embodiments disclosed herein utilize a noise measurement as an effective substitute for an INL measurement in order to distinguish between good and bad calibration runs in SAR ADCs with calibration. Various ones of the embodiments disclosed herein utilize a noise measurement as an effective substitute for an INL measurement in order to distinguish between good and bad calibration runs in SAR ADCs with calibration and dither.

In some embodiments, the calibration circuitry 110 (implemented, e.g., by one or more programmed processing devices) may analyze calibration runs and select the one with the least noise. For instance, the calibration circuitry 110 may analyze the digital output 122 of the ADC device 102 and use that digital output data to determine which calibration coefficients should be used. The calibration circuitry 110 may, in some embodiments, be implemented as an embedded custom programmable processor comprising a performance arbiter (to analyze ADC output data) and a sequencer (to adjust ADC settings). The performance arbiter and the sequencer may be implementations of the performance arbiter circuitry 112 and the sequencer circuitry 114, respectively. In some embodiments, the sequencer may initiate calibration multiple times. For example, the sequencer may run a calibration process multiple times, under varying bias/trim conditions for the ADC device 102, measure noise in each case, save the best calibration coefficients and bias/trim settings per channel, and apply the best settings prior to entering the normal mode of operation. By sweeping bias/trim settings, the calibration circuitry 110 can minimize the noise for a specific operating condition (supply, temperature, frequency, etc.), as discussed above.

The performance arbiter's function may be to measure noise in each run and pick the best run. The sequencer may save the best calibration coefficients and bias/trim settings per channel, and apply the best settings prior to entering the normal mode of operation. In some cases, the best settings associated with a specific ADC bias/trim condition can be applied to optimize the ADC for that specific ADC bias/trim condition. In some embodiments, the calibration circuitry 110 can operate with zero external overhead. In some embodiments, the programmable nature of the calibration circuitry 110 may ensure that the optimization algorithm can be catered to each customer's specific performance needs. The calibration circuitry 110 may be used with any ADC device with bias/trim controls to optimize settings for any specific operating condition (across frequency, supply, temperature, etc.).

In some embodiments, one or more of the techniques disclosed herein (e.g., the method 200 of FIG. 5) may be performed at every start-up of the system 100. This may advantageously minimize the customer programming overhead, but may require time to load and perform the technique. In some embodiments, one or more of the techniques disclosed herein (e.g., the method 200 of FIG. 5) may be run once at the factory, and the best calibration parameters and bias/trim settings may be stored in NVM and applied at every start-up of the system 100. This may minimize start-up time, but requires customer overhead as well as an external NVM (which may need to store, in some applications, approximately 10 kilobits). This approach may also not enable the calibration circuitry 110 to optimize performance of the ADC device 102 for different operating conditions.

In some embodiments, the system 100 may be implemented on a single chip (indicated by the chip boundary 126 in FIG. 1). Some such embodiments of the system 100 may speed up test time since data analysis can be performed on-chip.

The embodiments discussed above are applicable to any electronic devices. Non-limiting examples of such devices include medical systems, scientific instrumentation, wireless and wired communications, radar, industrial process control, audio and video equipment, and other instrumentation. One particularly useful application of the embodiments described herein is digital imaging, or other similar systems, where an ADC device can benefit from the calibration schemes described herein.

Parts of various apparatuses for calibrating ADC devices can include electronic circuitry to perform the functions described herein. In some cases, one or more parts of the apparatus can be provided by a processor specially configured for carrying out the functions described herein. For instance, the processor may include one or more application-specific components, or may include programmable logic gates, which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer medium.

In one example embodiment, any number of electrical circuits discussed herein may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc., can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits disclosed herein may be implemented as stand-alone modules (e.g., a device with associated components and circuitry configured to perform a specific application or function) or implemented as plug-in modules into application-specific hardware of electronic devices. Note that particular embodiments of the present disclosure may be readily included in a system-on-a-chip (SoC) package, either in part, or in whole. An SoC represents an integrated circuit (IC) that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the calibration functionalities may be implemented in one or more silicon cores in application specific integrated circuits (ASICs), field-programmable gate arrays (FPGAs), and other semiconductor chips.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the components disclosed herein may be combined in various possible configurations, all of which are within the scope of this specification. In certain cases, it may be easier to describe one or more of the functionalities of a given set of flows by only referencing a limited number of electrical elements. It should be appreciated that the electrical circuits disclosed herein are readily scalable and can accommodate a large number of components, as well as more complicated/sophisticated arrangements and configurations.

It is also important to note that the functions related to calibration of ADCs illustrate only some of the possible functions that may be executed by, or within, systems disclosed herein. Some of these operations may be deleted or removed where appropriate, or these operations may be modified or changed considerably without departing from the scope of the present disclosure. In addition, the timing of these operations may be altered. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

The following paragraphs provide examples of various ones of the embodiments disclosed herein.

Example 1 is a system for calibrating an analog-to-digital converter (ADC) device, including: the ADC device, wherein the ADC device includes an ADC and a dither source, and wherein the ADC device is to apply a set of calibration parameters to generate digital outputs; and calibration circuitry, coupled to the ADC device, to: determine a first amount of noise in a first plurality of digital outputs generated by the ADC device when the ADC device applies first values of the set of calibration parameters; determine a second amount of noise in a second plurality of digital outputs generated by the ADC device when the ADC device applies second values of the set of calibration parameters; determine that the second amount of noise is greater than the first amount of noise; and in response to the determination that the second amount of noise is greater than the first amount of noise, cause the ADC device to apply the first values of the set of calibration parameters.

Example 2 may include the subject matter of Example 1, and may further specify that determination of the first amount of noise in the first plurality of digital outputs generated by the ADC device includes: cause an input of the ADC device to be coupled to a reference voltage; wherein the first plurality of digital outputs generated by the ADC device are generated in response to the reference voltage at the input.

Example 3 may include the subject matter of any of Examples 1-2, and may further specify that determine the first amount of noise in the first plurality of digital outputs generated by the ADC device includes: determine a variance of the first plurality of digital outputs.

Example 4 may include the subject matter of any of Examples 1-3, and may further specify that the set of calibration parameters includes one or more dither calibration parameters.

Example 5 may include the subject matter of Example 4, and may further specify that the calibration circuitry is to select values for individual calibration parameters in the set of calibration parameters in a predetermined order, and the one or more dither calibration parameters are last in a predetermined order.

Example 6 may include the subject matter of any of Examples 4-5, and may further specify that the ADC device includes a switched capacitor digital-to-analog converter (DAC), the set of calibration parameters includes the individual calibration parameters for each individual bit capacitor in the switched capacitor DAC, and the individual calibration parameters for each individual bit capacitor are set before the one or more dither calibration parameters are set.

Example 7 may include the subject matter of Example 6, and may further specify that the one or more dither calibration parameters include individual calibration parameters for each of one or more dither capacitors.

Example 8 may include the subject matter of any of Examples 1-7, and may further specify that the ADC device includes correction circuitry that applies the set of calibration parameters to uncorrected digital outputs to generate corrected digital outputs, and wherein the first and second pluralities of digital outputs are corrected digital outputs.

Example 9 may include the subject matter of any of Examples 1-8, and may further specify that the ADC device and the calibration circuitry are included in a single chip.

Example 10 may include the subject matter of any of Examples 1-9, and may further specify that the ADC device includes a successive-approximation-register (SAR) ADC.

Example 11 is an electronic imaging device, including: an image sensor to generate analog image data; and a dithered analog-to-digital converter (ADC) device, coupled to the image sensor, wherein the dithered ADC device is to apply a set of calibration parameters to generate digital image data in response to the analog image data, and values for the set of calibration parameters are selected to minimize noise at grounded input level.

Example 12 may include the subject matter of Example 11, and may further specify that the dithered ADC device includes a switched capacitor digital-to-analog converter (DAC).

Example 13 may include the subject matter of any of Examples 11-12, and may further include interface circuitry to receive a calibration length for the dithered ADC device.

Example 14 may include the subject matter of any of Examples 11-13, and may further include interface circuitry to receive an updated calibration algorithm.

Example 15 may include the subject matter of any of Examples 11-14, and may further include circuitry to change a bias or trim setting of the dithered ADC device based on an operating condition of the dithered ADC device.

Example 16 is a method of calibrating an analog-to-digital converter (ADC) device, including: setting first values for a set of calibration parameters for the ADC device, wherein the ADC device includes a dither source and an ADC; after setting the first values, causing an input of the ADC device to couple to a reference voltage, and causing the ADC device to generate a first plurality of digital outputs; determining a first noise measure of the first plurality of digital outputs; setting second values for the set of calibration parameters for the ADC device; after setting the second values, causing the input of the ADC device to couple to the reference voltage, and causing the ADC device to generate a second plurality of digital outputs; determining a second noise measure of the second plurality of digital outputs; determining that the first noise measure is less than the second noise measure; and in response to the determination, setting values for the set of calibration parameters equal to the first values.

Example 17 may include the subject matter of Example 16, and may further include, prior to setting the first values for the set of calibration parameters for the ADC device, performing a calibration run to determine the first values.

Example 18 may include the subject matter of Example 17, and may further include, prior to setting the second values for the set of calibration parameters for the ADC device, performing a calibration run to determine the second values.

Example 19 may include the subject matter of any of Examples 16-18, and may further include: setting third values for the set of calibration parameters for the ADC device; after setting the third values, causing the input of the ADC device to couple to the reference voltage, and causing the ADC device to generate a third plurality of digital outputs; determining a third noise measure of the third plurality of digital outputs; determining that the third noise measure is less than the first noise measure and less than the second noise measure; and in response to the determination, setting values for the set of calibration parameters equal to the third values.

Example 20 may include the subject matter of any of Examples 16-19, and may further specify that the ADC device is included in an electronic device, and the method is performed upon start-up of the electronic device.

The invention claimed is:

1. A system for calibrating an analog-to-digital converter (ADC) device, comprising:
    the ADC device, wherein the ADC device includes an ADC and a dither source, and wherein the ADC device is to apply a set of calibration parameters to generate digital outputs; and
    calibration circuitry, coupled to the ADC device, to:
        determine a first amount of noise in a first plurality of digital outputs generated by the ADC device when the ADC device applies first values of the set of calibration parameters;
        determine a second amount of noise in a second plurality of digital outputs generated by the ADC device when the ADC device applies second values of the set of calibration parameters;
        determine that the second amount of noise is greater than the first amount of noise; and
        in response to the determination that the second amount of noise is greater than the first amount of noise, cause the ADC device to apply the first values of the set of calibration parameters.

2. The system of claim 1, wherein determine the first amount of noise in the first plurality of digital outputs generated by the ADC device comprises:
    cause an input of the ADC device to be coupled to a reference voltage;
    wherein the first plurality of digital outputs generated by the ADC device are generated in response to the reference voltage at the input.

3. The system of claim 1, wherein determine the first amount of noise in the first plurality of digital outputs generated by the ADC device comprises:
    determine a variance of the first plurality of digital outputs.

4. The system of claim 1, wherein the set of calibration parameters includes one or more dither calibration parameters.

5. The system of claim 4, wherein the calibration circuitry is to select values for individual calibration parameters in the set of calibration parameters in a predetermined order, and the one or more dither calibration parameters are last in the predetermined order.

6. The system of claim 4, wherein the ADC device includes a switched capacitor digital-to-analog converter (DAC), the set of calibration parameters includes individual calibration parameters for each individual bit capacitor in the switched capacitor DAC, and the individual calibration parameters for each individual bit capacitor are set before the one or more dither calibration parameters are set.

7. The system of claim 6, wherein the one or more dither calibration parameters include individual calibration parameters for each of one or more dither capacitors.

8. The system of claim 1, wherein the ADC device includes correction circuitry that applies the set of calibration parameters to uncorrected digital outputs to generate corrected digital outputs, and wherein the first and second pluralities of digital outputs are corrected digital outputs.

9. The system of claim 1, wherein the ADC device and the calibration circuitry are included in a single chip.

10. The system of claim 1, wherein the ADC device includes a successive-approximation-register (SAR) ADC.

11. An electronic imaging device, including:
    an image sensor to generate analog image data;
    a dithered analog-to-digital converter (ADC) device, coupled to the image sensor, wherein the dithered ADC device is to apply a set of calibration parameters to generate digital image data in response to the analog image data;
    calibration circuitry, coupled to the dithered ADC device, to:
        determine, for each of a plurality of sets of values of calibration parameters, an associated amount of noise in a plurality of digital outputs generated by the dithered ADC device when the dithered ADC device applies an associated set of values of the calibration parameters;
        determine a minimum of the amounts of noise; and
        in response to the determination of the minimum amount of noise, cause the dithered ADC device to apply the set of values of the calibration parameters associated with the minimum amount of noise.

12. The electronic imaging device of claim 11, wherein the dithered ADC device includes a switched capacitor digital-to-analog converter (DAC).

13. The electronic imaging device of claim 11, further comprising:
    interface circuitry to receive a calibration length for the dithered ADC device.

14. The electronic imaging device of claim 11, further comprising:
    interface circuitry to receive an updated calibration algorithm.

15. The electronic imaging device of claim 13, further comprising:
    circuitry to change a bias or trim setting of the dithered ADC device based on an operating condition of the dithered ADC device.

16. A method of calibrating an analog-to-digital converter (ADC) device, comprising:
    setting first values for a set of calibration parameters for the ADC device, wherein the ADC device includes a dither source and an ADC;
    after setting the first values, causing an input of the ADC device to couple to a reference voltage, and causing the ADC device to generate a first plurality of digital outputs;
    determining a first noise measure of the first plurality of digital outputs;
    setting second values for the set of calibration parameters for the ADC device;

after setting the second values, causing the input of the ADC device to couple to the reference voltage, and causing the ADC device to generate a second plurality of digital outputs;

determining a second noise measure of the second plurality of digital outputs;

determining that the first noise measure is less than the second noise measure; and in response to the determination, setting values for the set of calibration parameters equal to the first values.

17. The method of claim 16, further comprising:
prior to setting the first values for the set of calibration parameters for the ADC device, performing a calibration run to determine the first values.

18. The method of claim 17, further comprising:
prior to setting the second values for the set of calibration parameters for the ADC device, performing a calibration run to determine the second values.

19. The method of claim 16, further comprising:
setting third values for the set of calibration parameters for the ADC device;

after setting the third values, causing the input of the ADC device to couple to the reference voltage, and causing the ADC device to generate a third plurality of digital outputs;

determining a third noise measure of the third plurality of digital outputs;

determining that the third noise measure is less than the first noise measure and less than the second noise measure; and in response to the determination, setting values for the set of calibration parameters equal to the third values.

20. The method of claim 16, wherein the ADC device is included in an electronic device, and the method is performed upon start-up of the electronic device.

* * * * *